US009795054B2

(12) United States Patent
Reynov et al.

(10) Patent No.: US 9,795,054 B2
(45) Date of Patent: Oct. 17, 2017

(54) CHASSIS SYSTEM WITH FRONT COOLING INTAKE

(71) Applicant: JUNIPER NETWORKS, INC., Sunnyvale, CA (US)

(72) Inventors: Boris Reynov, Cupertino, CA (US); Jack Kohn, Mountain View, CA (US); Euan F Mowat, Concord, MA (US); Shreeram Siddhaye, Sunnyvale, CA (US); Ben Nitzan, El Granada, CA (US); Mahesh Nagarajan, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 7 days.

(21) Appl. No.: 14/788,652

(22) Filed: Jun. 30, 2015

(65) Prior Publication Data

US 2015/0305193 A1    Oct. 22, 2015

Related U.S. Application Data

(63) Continuation of application No. 13/848,952, filed on Mar. 22, 2013, now Pat. No. 9,089,073, which is a continuation of application No. 12/877,710, filed on Sep. 8, 2010, now Pat. No. 8,405,985.

(51) Int. Cl.
*H05K 7/18* (2006.01)
*H05K 7/20* (2006.01)

(52) U.S. Cl.
CPC ........... *H05K 7/20127* (2013.01); *H05K 7/18* (2013.01); *H05K 7/20* (2013.01); *H05K 7/20736* (2013.01); *H05K 7/20745* (2013.01); *Y10T 29/49* (2015.01)

(58) Field of Classification Search
CPC .. H05K 7/20; H05K 7/20745; H05K 7/20127; H05K 5/02; G06F 1/20
USPC .............. 361/679.46, 679.48, 679.49, 679.5, 361/690–695, 719–722; 165/80.2, 165/104.33, 121–126; 454/184; 312/223.2
See application file for complete search history.

(56) References Cited

U.S. PATENT DOCUMENTS

| | | |
|---|---|---|
| 4,293,891 A | 10/1981 | Matsui et al. |
| 4,447,856 A | 5/1984 | Takahashi et al. |
| 4,758,925 A | 7/1988 | Obata et al. |
| 4,774,631 A | 9/1988 | Okuyama et al. |
| 5,063,477 A | 11/1991 | Paggen et al. |
| 5,398,159 A | 3/1995 | Andersson et al. |
| 5,995,368 A | 11/1999 | Lee et al. |
| 6,052,282 A | 4/2000 | Sugiyama et al. |
| 6,499,609 B2 * | 12/2002 | Patriche ............... H05K 7/1425 211/175 |
| 6,625,020 B1 | 9/2003 | Hanson et al. |
| 6,778,386 B2 | 8/2004 | Garnett et al. |

(Continued)

*Primary Examiner* — Courtney Smith
(74) *Attorney, Agent, or Firm* — Harrity & Harrity, LLP

(57) ABSTRACT

A line card includes a metal frame that includes a front section, and a bottom section connected to the front section via an angled section, where the angled section results in an opening between the line card and a second line card, when the line card is installed above the second line card in a rack, and where the opening allows directed air to enter the rack from a front direction; a printed circuit board attached to the metal frame; and a group of front panel connectors attached to the front section of the metal frame.

20 Claims, 6 Drawing Sheets

(56) References Cited

U.S. PATENT DOCUMENTS

| | | | | |
|---|---|---|---|---|
| 7,277,296 B2 * | 10/2007 | Ice | ............... | H05K 7/1418 |
| | | | | 361/679.41 |
| 7,298,607 B2 * | 11/2007 | Zielnicki | ............... | G06F 1/183 |
| | | | | 174/520 |
| 7,355,850 B2 | 4/2008 | Baldwin, Jr. | | |
| 7,450,377 B2 * | 11/2008 | Matsumoto | ........ | H05K 7/20154 |
| | | | | 361/679.48 |
| 7,679,920 B2 * | 3/2010 | Musciano | .......... | H05K 7/20727 |
| | | | | 174/16.1 |
| 7,920,387 B2 * | 4/2011 | Barrett | ............. | H05K 7/1418 |
| | | | | 361/741 |
| 8,064,200 B1 | 11/2011 | West et al. | | |
| 8,257,156 B2 * | 9/2012 | Shabany | ............ | H05K 7/20572 |
| | | | | 361/695 |
| 8,405,985 B1 * | 3/2013 | Reynov | ............. | H05K 7/20736 |
| | | | | 361/688 |
| 9,380,730 B2 * | 6/2016 | Zhuang | ............... | H05K 9/0041 |
| 9,578,761 B2 * | 2/2017 | Chitaka | ............... | H05K 5/00 |
| 2007/0076371 A1 | 4/2007 | Chou et al. | | |
| 2007/0253159 A1 * | 11/2007 | Lin | ............ | G06F 1/181 |
| | | | | 361/679.46 |
| 2009/0002938 A1 | 1/2009 | Stewart et al. | | |
| 2009/0323282 A1 * | 12/2009 | Holdredge | ........ | H05K 7/20145 |
| | | | | 361/694 |
| 2010/0008025 A1 * | 1/2010 | Nemoz | ............. | H05K 7/20563 |
| | | | | 361/678 |
| 2010/0046181 A1 * | 2/2010 | Barrett | ............. | H05K 7/1418 |
| | | | | 361/756 |
| 2013/0213909 A1 | 8/2013 | Reynov et al. | | |

* cited by examiner

CHASSIS SYSTEM WITH FRONT COOLING INTAKE

RELATED APPLICATION

This application is a continuation application of U.S. patent application Ser. No. 13/848,952, filed Mar. 22, 2013, which is a continuation of U.S. patent application Ser. No. 12/877,710, filed Sep. 8, 2010 (now U.S. Pat. No. 8,405,985), the entire contents of which are hereby incorporated by reference.

BACKGROUND

An electronic device may include components, such as integrated circuits (ICs), which may need to be secured to a mechanically rigid substrate. Such components may be mounted on a printed circuit board (PCB), which may provide structural stability. The PCB may be incorporated into a line card which may include connectors for interacting with other electronic devices. Multiple line cards may be mounted into a chassis of a rack. During operation, electronic components of the line card, such as ICs, may generate heat. It may be necessary to cool line cards mounted in a rack to ensure that the line cards do not exceed a safe operating temperature. However, cooling components of line cards mounted in a rank unit may prove to be particularly challenging.

SUMMARY OF THE INVENTION

According to one aspect, a line card may include a metal frame including a front section, and a bottom section connected to the front section via an angled section, where the angled section results in an opening between the line card and a second line card, when the line card is installed above the second line card in a rack, and where the opening allows directed air to enter the rack from a front direction; a PCB attached to the metal frame; and a group of front panel connectors attached to the front section of the metal frame.

According to another aspect, a rack may include a group of line cards mounted in the rack; and a group of openings located between adjacent ones of the group of line cards, a particular opening extending substantially a width of the rack and located between a first particular line card and a second particular line card, where the first particular line card is mounted immediately above the second particular line card, and where the group of openings allow directed air to enter the rack from a front direction.

According to another aspect, a method, of forming a metal frame for a line card, may include forming a front section of the metal frame; forming an angled section, where the angled section connects a bottom section of the metal frame to the front section, where the angled section results in an opening between the line card and a second line card, when the line card is installed above the second line card in a rack, and where the opening allows directed air to enter the rack from a front direction.

BRIEF DESCRIPTION OF THE DRAWINGS

The accompanying drawings, which are incorporated in and constitute a part of this specification, illustrate the invention and, together with the description, explain the invention. In the drawings.

DETAILED DESCRIPTION

Figure 1:
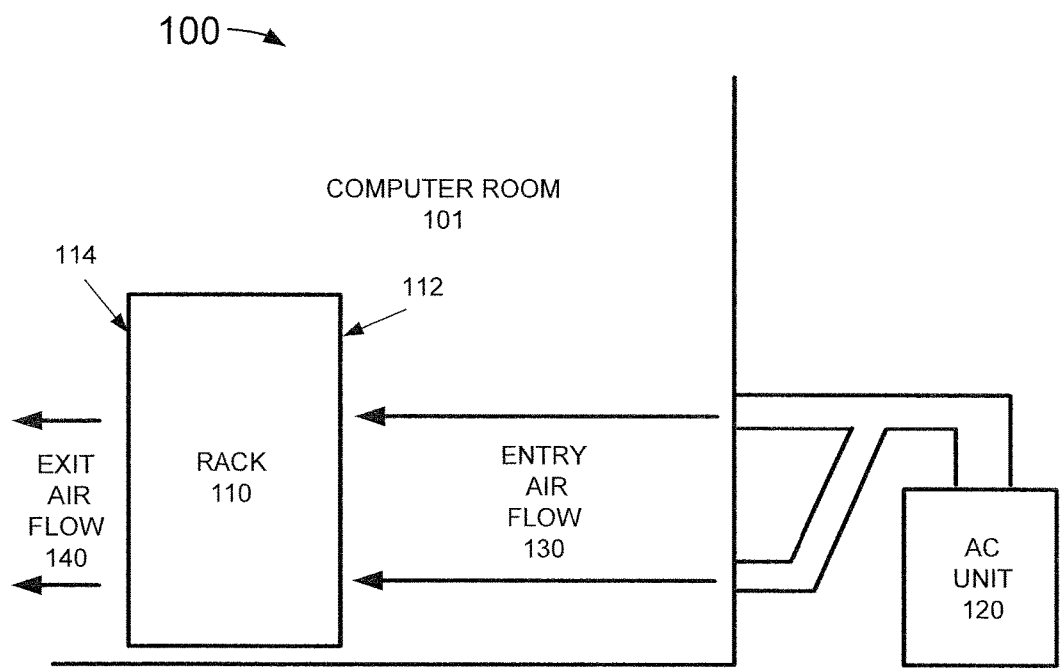
FIG. 1 is a diagram illustrating an example system according to an implementation described herein.

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

A rack may include line cards mounted onto the chassis of the rack. The line cards may include a high density of connectors that utilize most of the front panel area. A computer room with racks may be implemented with an air conditioning (AC) cooling system that employs a front to back cooling scheme. As a result of the high density of the front panel connectors, and because individual line cards may be mounted closely together, it may be difficult to achieve efficient front to back cooling, as there may not be a way for air to enter the rack from the front. As the incoming cooling air may not be able to enter the rack from the front, the air may need to enter from the sides of the rack, which may result in inefficient cooling of the electronic components of the line cards.

An implementation described herein may relate to a chassis system with front cooling air intake. A line card may include a modified metal frame with a recessed bottom. A recessed bottom may be achieved by including an angled section in the bottom of the line card frame, resulting in an opening with the shape of a long slot with a length that is substantially equal to a width of the line card, when the line card is mounted in a chassis of a rack. The resulting opening in a first line card provides a way for the air to enter the rack from the front, allowing the air to cool the components of a second line card located below the first line card.

Another implementation described herein may include a line card with a modified metal frame with a recessed bottom and an extended upper part of the frame. The extended upper part of a second line card may abut the angled portion of a recessed bottom of a first line card located on top of the second line card, when the first and second line cards are mounted onto a chassis of a rack. The extended upper part of the line card frame may include one or more openings to allow for air flow. The openings may be small enough to prevent electromagnetic (EM) interference, while allowing air to enter the space between two line cards.

Yet another implementation described herein may include a line card with a modified metal frame with a recessed bottom and an extended upper part of the frame that includes openings of varying density. The density of the openings in the extended upper part of the frame may be increased at locations corresponding to locations of heat generating components. The increased density of the openings may allow more air to flow through the location corresponding to the heat generating components, causing the heat generating components to be cooled at a higher rate than other areas of a PCB of the line card. Furthermore, a backplane of the rack may be designed with exhaust fans and/or openings that line up with an area of increased density of openings, allowing more air to flow across the heat generating components in a front-to-back direction in relation to the rack.

FIG. 1 is a diagram illustrating an example system 100 according to an implementation described herein. As shown in FIG. 1, system 100 may include one or more racks 110 (referred to herein as "racks 110" collectively and "rack 110" individually), located in a computer room 101, and an air conditioning (AC) unit 120. Racks 110 in computer room 101 may be arranged sequentially next to each other so that the front panels of racks 110 face AC unit 120.

Rack 110 may include a chassis with a front panel 112, with line cards mounted on front panel 112, a backplane 114 that includes connectors to connect to the line cards and allow communication between particular line cards, and/or a power supply (not shown in FIG. 1) to supply electrical power to the line cards and to the backplane. Rack 110 may provide structural stability for line cards mounted in rack 110, may provide a space-efficient way to store and organize line cards, may provide EM shielding for the line cards, and may provide a mechanism that allows communications between individual line cards (e.g., via a backplane). Fronts of line cards, mounted in front panel 112, may include front connectors for connecting particular line cards with other devices.

AC unit 120 may cool racks 110. AC unit 120 may be located within computer room 101 or outside computer room 101 and may generate entry air flow 130. Entry air flow 130 may be directed at front panels of racks 110. Front panel 112 of racks 100 may include openings for allowing entry air flow 130 to enter racks 110 substantially in a front-to-back direction. Backplane 114 of rack 110, which may be located parallel to front panel 112, may include openings and/or exhaust fans for facilitating exit air flow 140.

Although FIG. 1 shows example components of system 100, in other implementations, system 100 may include fewer components, different components, differently arranged components, or additional components than depicted in FIG. 1. Additionally or alternatively, one or more components of system 100 may perform the tasks described as being performed by one or more other components of system 100.

Figure 2:
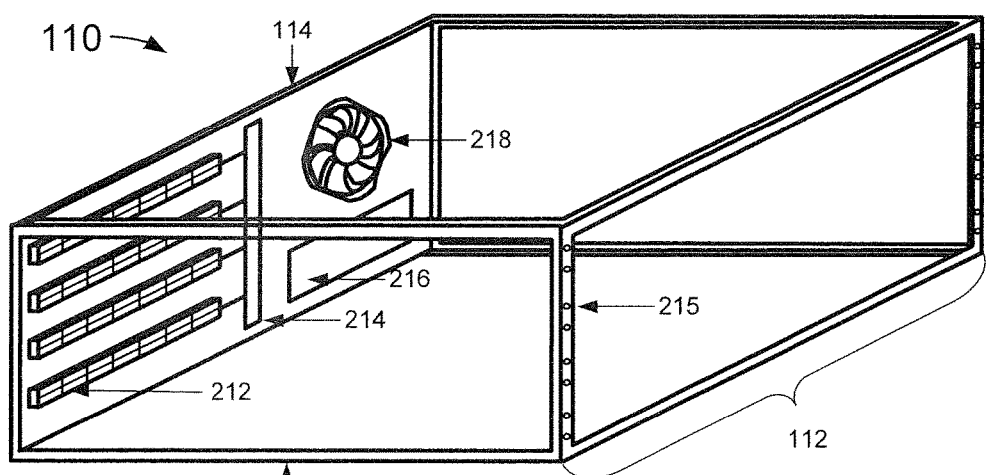
FIG. 2 is a diagram illustrating an example rack according to an implementation described herein.

FIG. 2 is a diagram illustrating an example rack 110 according to an implementation described herein. FIG. 2 depicts rack 110 as an empty rack without any installed line cards. As shown in FIG. 2, rack 110 may include a chassis frame 210 and a backplane 114. Chassis frame 210 may provide structural stability to rack 110 and may include front panel 112. Front panel 112 may include mounting area 215. Mounting area 215 may include, for example, holes that may accommodate screws used to mount particular line cards. Chassis frame 210 may include panels that cover the top, bottom, and sides of rank 110 (not shown in FIG. 2), to provide additional structural stability to rack 110, protect line cards from the outside environment, to provide EM shielding of line cards, to give rack 110 a more esthetic appearance, etc.

Backplane 114 may be mounted on a back surface of chassis frame 210 in a direction substantially parallel to front panel 112. Backplane 114 may include one or more line card connectors 212, a bus 214, one or more openings 216 (referred to herein collectively as "openings 216" and individually as "opening 216"), and one or more exhaust fans 218 (referred to herein collectively as "exhaust fans 218" and individually as "exhaust fan 218").

Line card connectors 212 may electrically connect particular line cards to backplane 114. Bus 214 may connect to line card connectors 212 and may allow communications between particular line cards. Opening 216 may facilitating exit air flow 140 by allowing air, entering via front panel 112, to exit rack 110. Additionally or alternatively, exhaust fan 218 may facilitate exit air flow 140 by directing air, entering via front panel 112, to exit rack 112 via rotating fan blades. Rack 114 may include a power supply (not shown in FIG. 2), located either inside rack 110 or outside rack 110, for supplying electrical power to backplane 114 and to any line cards installed in rack 110.

Although FIG. 2 shows example components of rack 110, in other implementations, rack 110 may include fewer components, different components, differently arranged components, or additional components than depicted in FIG. 2. Additionally or alternatively, one or more components of rack 110 may perform the tasks described as being performed by one or more other components of rack 110.

Figure 3A:
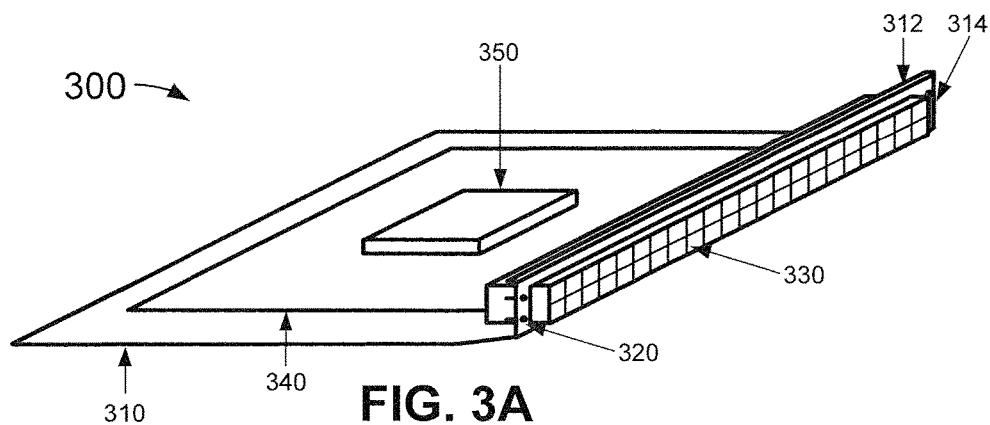
FIG. 3A is a diagram illustrating a first view of a line card according to a first implementation described herein.
Figure 3B:
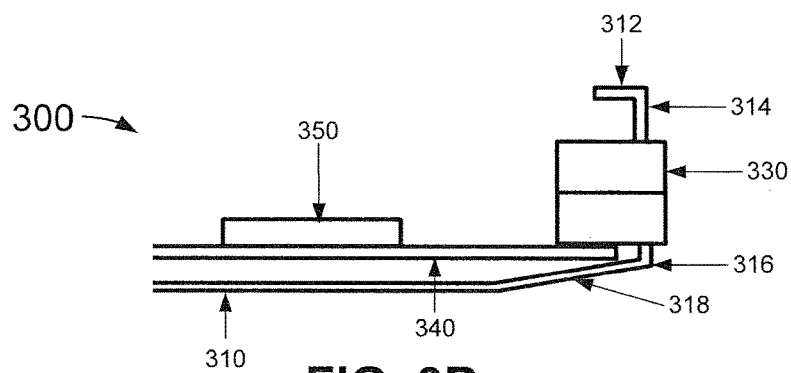
FIG. 3B is a diagram illustrating a second view of a line card according to the first implementation described herein.

FIGS. 3A and 3B are diagrams illustrating a line card 300 according to a first implementation described herein. FIG. 3A depicts a three-dimensional view of line card 300 and FIG. 3B depicts a side view of line card 300. As shown in FIGS. 3A and 3B, line card 300 may include a cookie sheet frame 310, mounting hardware 320, front connectors 330, and a PCB 340.

Cookie sheet frame 310 may include a metal frame for providing structural stability to PCB 340 and front connectors 330. Cookie sheet frame 310 may have a width that extends substantially the width of front panel 112 (i.e., an inside width of rank 110), so that line card 300 fits inside front panel 112 and may be mounted onto front panel 112 via mounting area 215. Cookie sheet frame 310 may have a depth substantially the depth of chassis frame 210, so that line card 300 fits inside rack 110 and so that a connector 212 of backplane 114 connects to a back connector (not shown in FIGS. 3A and 3B) of PCB 340. Cookie sheet frame 310 may provide partial or complete EM shielding to PCB 340 and/or to front connectors 330.

Cookie sheet frame 310 may include a top portion 312, a front portion 314, and a bottom portion 316. Top portion 312 may facilitate handling of line card 300 during installation. Front portion 314 may secure connectors 330 in place and may partially secure PCB 340 in place. Front portion 314 may include mounting hardware 320. Mounting hardware 320 may include, for example, screws to mount line card 300 using mounting area 215.

Bottom portion 316 may include an angled section 318. Angled section 318 may provide a recessed area that may create an opening between line card 300 and another line card mounted below line card 300. The opening may allow entry air flow 130 to enter an area above PCB 340 of the line card mounted below line card 300 and cool components mounted on PCB 340 of the line card mounted below line card 300.

Front connectors 330 may provide electrical and/or optical connectors to cables that may provide electrical and/or optical connections to other electronic devices (e.g., other line cards mounted on rack 110 or line cards mounted in another rack). The number of front connectors 330 included in line card 300 may depend on a size of rack 110 and line card 300 and may be maximized to take up most of the area of front portion 314 of cookie sheet frame 310. For example, for a standard 19 inch rack, connectors 330 may include 48 connectors, in two rows of 24.

PCB 340 may provide a structurally stable substrate for mounting electrical and/or optical components of line card 300 and may include electrical and/or optical connections between the electrical and/or optical components. PCB 340 may include one or more components 350 (referred to herein collectively as "components 350" and individually as "component 350").

Component 350 may include, for example, ICs such as processors or processing logic (e.g., application specific integrated circuits (ASICs) or field programmable gate arrays (FPGAs)) that may interpret and execute instructions, and/or memory devices, such as a random access memory (RAM) device or another type of dynamic storage device, a read only memory (ROM) device or another type of static storage device, a magnetic and/or optical recording memory device and its corresponding drive, and/or a removable form of memory, such as a flash memory.

Although FIGS. 3A and 3B show example components of line card 300, in other implementations, line card 300 may include fewer components, different components, differently arranged components, or additional components than depicted in FIGS. 3A and 3B. Additionally or alternatively, one or more components of line card 300 may perform the tasks described as being performed by one or more other components of line card 300.

Figure 4A:
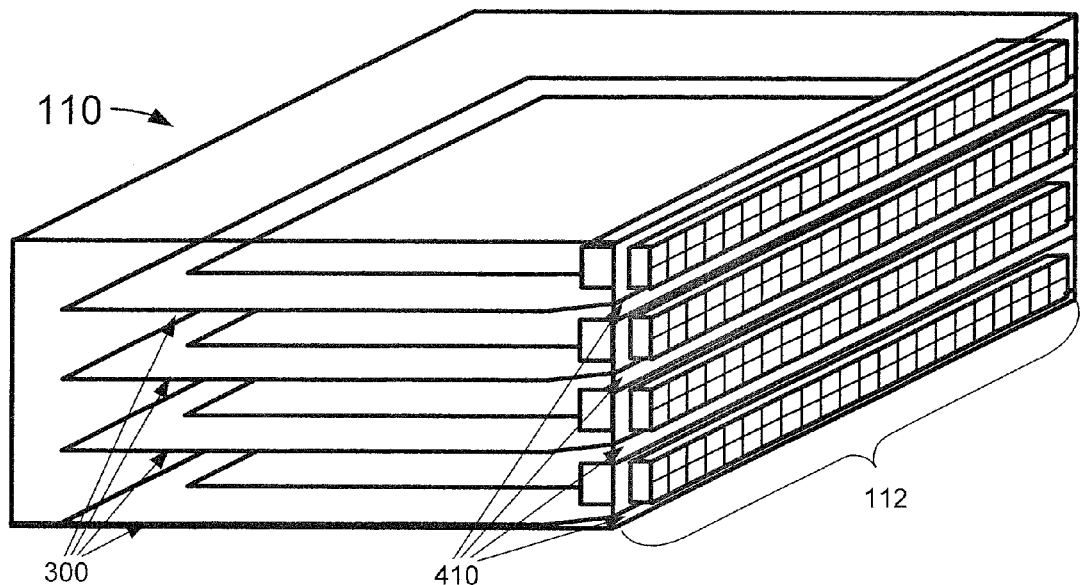
FIG. 4A is a diagram illustrating the rack of FIG. 2 with installed line cards according to an implementation described herein.
Figure 4B:
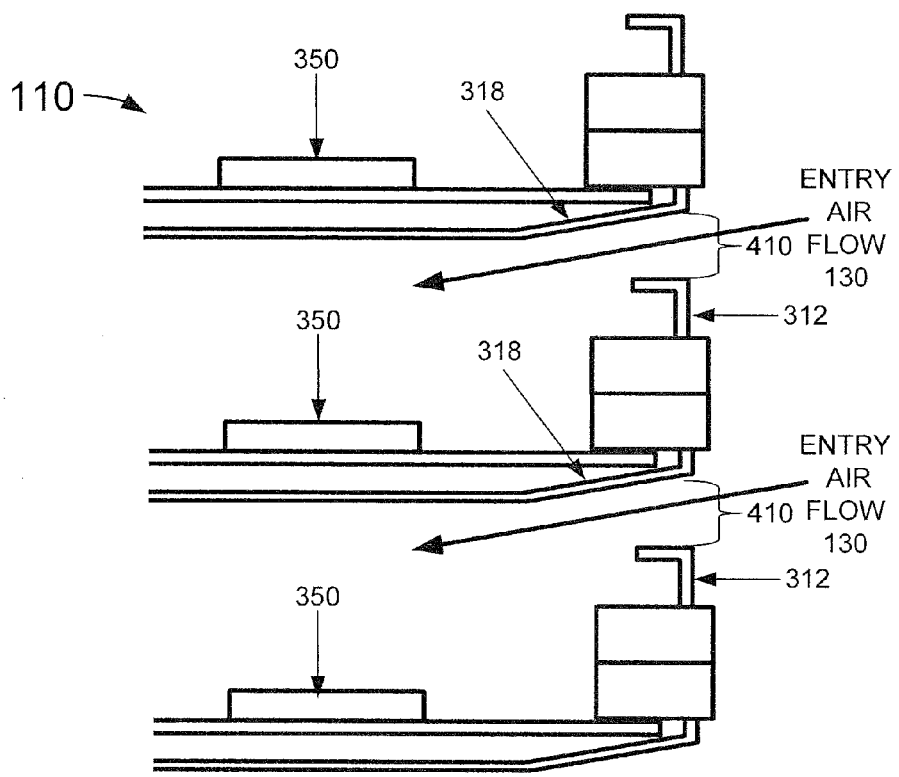
FIG. 4B is a diagram illustrating air flow in a rack with line cards according to the first implementation described herein.

FIG. 4A is a diagram illustrating rack of 110 with installed line cards according to an implementation described herein. FIG. 4B is a diagram illustrating a side view of rack 110 and depicts air flow in rack 110, with installed line cards 300, according to the first implementation described herein. As shown in FIGS. 4A and 4B, line cards 300 are installed with front connectors 330 located in the area of front panel 112. As a result of angled sections 318, which provide a recessed area in bottom portion 314, an opening 410 is created between a first line card and a second line card mounted below the first line card.

The height of opening 410 may be determined based on the length and angle of angled section 318. The width of opening 410 may extend substantially the width of rack 110. Opening 410 allows entry air flow 130 to enter an area between cookie sheet frame 310 of a first line card and a PCB 340 of a second line card, which is mounted below the first line card in rack 110. When entry air flow 130 enters the area, the cool air may cool components 350 of the second line card. After cooling air components 350, the air may proceed to exit the area through opening 216 and/or exhaust fan 218 of backplane 114.

Figure 5A:
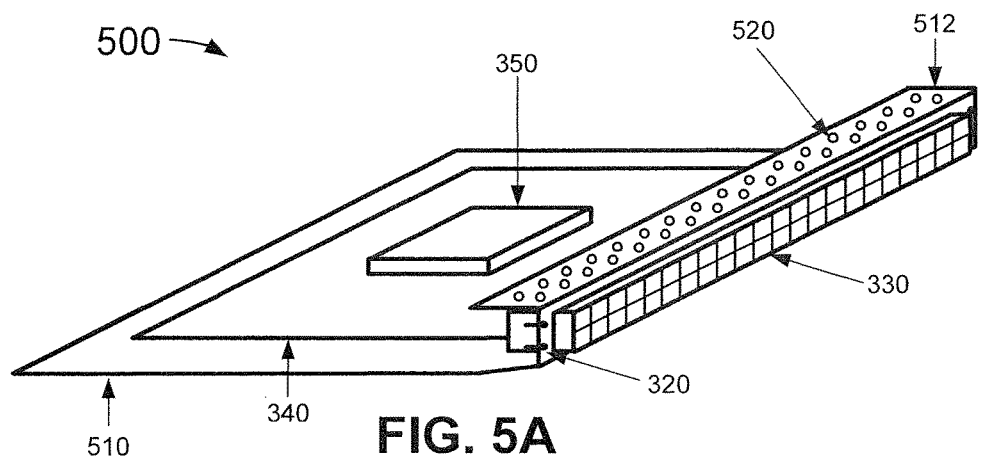
FIG. 5A is a diagram illustrating a line card according to a second implementation described herein.
Figure 5B:
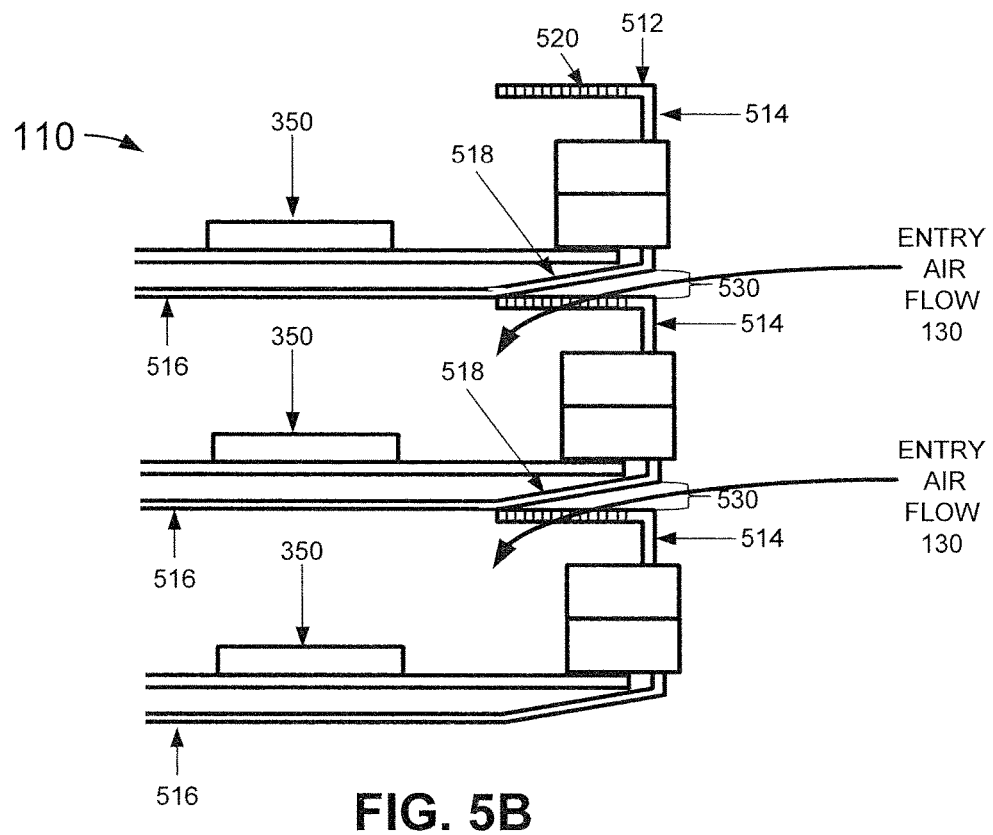
FIG. 5B is a diagram illustrating air flow in a rack with line cards according to the second implementation described herein.

FIGS. 5A and 5B are diagrams illustrating a line card 500 according to a second implementation described herein. FIG. 5A depicts a three-dimensional view of line card 500. FIG. 5B depicts a side view of rack 110 and depicts air flow in rack 110, with installed line cards 500, according to the second implementation described herein. As shown in FIGS. 5A and 5B, line card 500 may include a cookie sheet frame 510, mounting hardware 320, front connectors 330, and PCB 340.

Cookie sheet frame 510 may include a metal frame for providing structural stability to PCB 340 and front connectors 330. Cookie sheet frame 510 may have a width that extends substantially the width of front panel 112, so that line card 500 fits inside front panel 112 and may be mounted onto front panel 112 via mounting area 215. Cookie sheet frame 510 may have a depth substantially the depth of chassis frame 210, so that line card 500 fits inside rack 110 and so that a connector 212 of backplane 114 connects to a back connector (not shown in FIGS. 5A and 5B) of PCB 340. Cookie sheet frame 510 may provide partial or complete EM shielding to PCB 340 and/or to front connectors 330.

As shown in FIG. 5B, cookie sheet frame 510 may include an extended top portion 512, a front portion 514, and a bottom portion 516. Extended top portion 512 may extend in a direction away from front connectors 330, so that when line card 500 is installed in rack 110, the extended top portion contacts the bottom portion of the cookie sheet frame of a line card installed above line card 500. Extended top portion 512 may include openings 520. In one implementation, openings 520 may be of equal size and distributed evenly across substantially all of extended top portion 512. In another implementation, openings 520 may not all be of equal size, and/or may not be distributed evenly, and/or may not be distributed across all of extended top portion 512.

Extended top portion 512 may shield line card 500 from EM interference. Extended top portion 512 of cookie sheet frame 510 of line card 500, together with bottom portion 516 of cookie sheet frame 510 of line card 500, bottom portion 516 of cookie sheet frame 510 of a line card installed above line card 500, and side panels of rack 110, may form a Faraday cage around PCB 340 of line card 500, thus protecting PCB 340 from external EM radiation.

Openings 520 may render extended top portion 512 transparent to air flow and not transparent to EM interference. In other words, openings 520 may be large enough to allow entry air flow 130 to pass through extended top portion 512 and small enough to prevent EM radiation of particular frequencies to pass through extended top portion 512. Openings 520 may be smaller than a wavelength of any EM radiation that is to be prevented from penetrating extended top portion 512. For example, openings in the range of 1-3 mm in diameter may block EM radiation in the GHz range.

Front portion 514 may include mounting hardware 320. Mounting hardware 320 may include, for example, screws to mount line card 500 using mounting area 215. Bottom portion 516 may include an angled section 518. Angled section 518 may provide a recessed area that may create an opening 530 between line card 500 and another line card mounted below line card 500. Opening 530 may allow entry air flow 130 to enter, through openings 520 of extended top portion 512, the area above the PCB of the line card mounted below line card 500 and cool components mounted on the PCB of the line card mounted below line card 500.

Front connectors 330 may provide electrical and/or optical connectors to cables that may provide electrical and/or optical connections to other electronic devices (e.g., other line cards mounted on rack 110 or line cards mounted in another rack). The number of front connectors 330 included in line card 500 may depend on a size of rack 110 and line card 500 and may be maximized to take up most of the area of front portion 514 of cookie sheet frame 510. For example, for a standard 19 inch rack, connectors 330 may include 48 connectors, in two rows of 24.

PCB 340 may provide a structurally stable substrate for mounting electrical and/or optical components of line card 500 and may include electrical and/or optical connections between the electrical and/or optical components. PCB 340 may include one or more components 350.

Although FIGS. 5A and 5B show example components of line card 500, in other implementations, line card 500 may include fewer components, different components, differently arranged components, or additional components than depicted in FIGS. 5A and 5B. Additionally or alternatively, one or more components of line card 500 may perform the tasks described as being performed by one or more other components of line card 500.

Figure 6A:
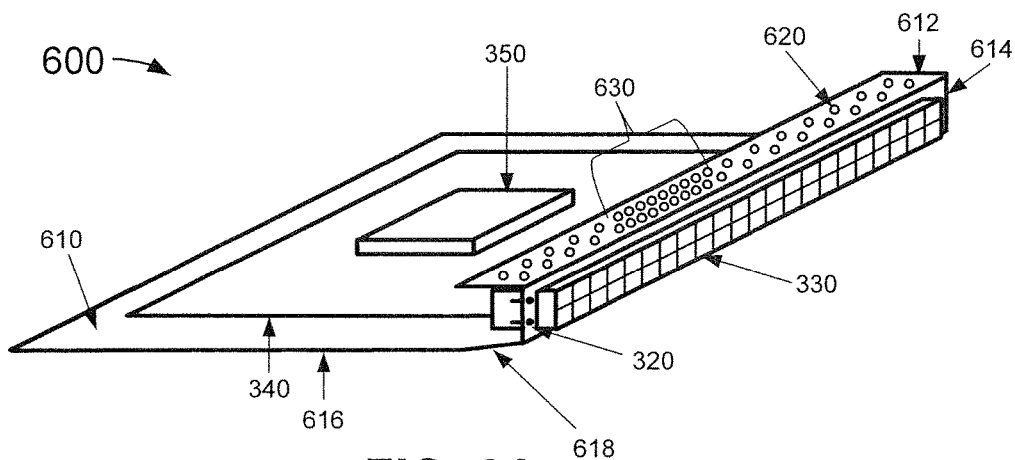
FIG. 6A is a diagram illustrating a line card according to a third implementation described herein.
Figure 6B:
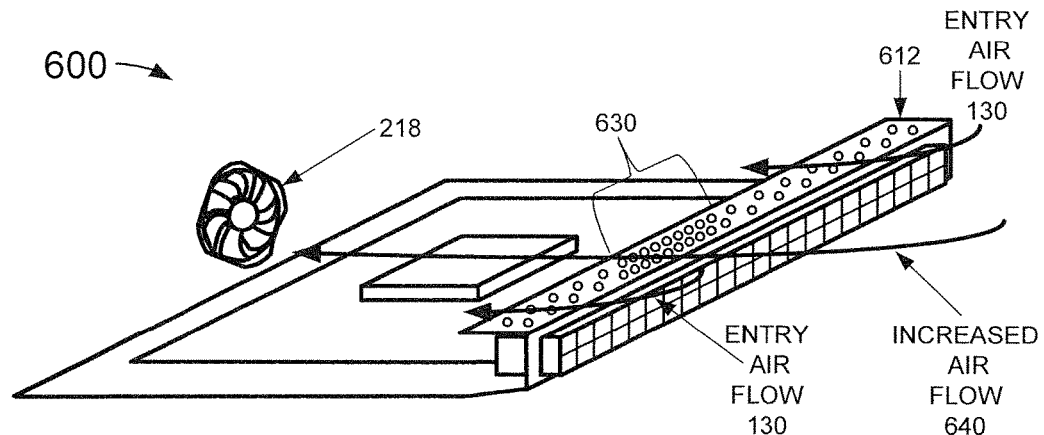
FIG. 6B is a diagram illustrating air flow in a rack with a line card according to the third implementation described herein.

FIGS. 6A and 6B are diagrams illustrating a line card 600 according to a third implementation described herein. FIG. 6A depicts a three-dimensional view of line card 600. FIG. 6B depicts air flow across line card 600, according to the third implementation described herein. As shown in FIGS. 6A and 6B, line card 600 may include a cookie sheet frame 610, mounting hardware 320, front connectors 330, and PCB 340.

Cookie sheet frame 610 may include a metal frame for providing structural stability to PCB 340 and front connectors 330. Cookie sheet frame 610 may have a width that extends substantially the width of front panel 112, so that line card 600 fits inside front panel 112 and may be mounted onto front panel 112 via mounting area 215. Cookie sheet frame 610 may have a depth substantially the depth of chassis frame 210, so that line card 600 fits inside rack 110 and so that a connector 212 of backplane 114 connects to a back connector (not shown in FIGS. 6A and 6B) of PCB 340. Cookie sheet frame 610 may provide partial or complete EM shielding to PCB 340 and/or to front connectors 330.

Cookie sheet frame 610 may include an extended top portion 612, a front portion 614, and a bottom portion 616. Extended top portion 612 may extend in a direction away from front connectors 330, so that when line card 600 is installed in rack 110, extended top portion 612 contacts bottom portion 616 of the cookie sheet frame of a line card installed above line card 600. Extended top portion 612 may include openings 620.

Extended top portion 612 may shield line card 600 from EM interference. Extended top portion 612 of cookie sheet frame 610 of line card 600, together with bottom portion 616 of cookie sheet frame 610 of line card 600, bottom portion 616 of cookie sheet frame 610 of a line card installed above line card 600, and side panels of rack 110, may form a Faraday cage around PCB 340 of line card 600, thus protecting PCB 340 from external EM radiation.

Openings 620 may render extended top portion 612 transparent to air flow and not transparent to EM interference. In other words, openings 620 may be large enough to allow entry air flow 130 to pass through extended top portion 612 and small enough to prevent EM radiation of particular frequencies to pass through extended top portion 612. Openings 620 may be smaller than a wavelength of any EM radiation that is to be prevented from penetrating extended top portion 612.

Extended top portion 612 may include an increased density area 630. Increased density area 630 may include an area with an increased density of openings 620. Increased density area 630 may correspond to a location of component 350 (for example, a heat generating component) mounted on PCB 340. As shown in FIG. 6B, the increased density of the openings in increased density area 630 may allow increased air flow 640, of entry air flow 130, to flow through the location corresponding to component 350 (for example, a heat generating component), causing heat generating component 350 to be cooled at a higher rate than other areas of PCB 340. While FIGS. 6A and 6B depict a single increased density area 630 aligned with a particular component 150, line card 600 may include multiple increased density areas 630. For example, line card 600 may include a particular increased density area 630 aligned with each particular component 350 that is determined to need increased air flow.

Exhaust fan 218 may be aligned with increased density area 630 to allow more air to flow over component 350 and pull air out of rack 110. While FIG. 6B depicts a single exhaust fan 218 aligned with a single increased density area 630, if line card 600 includes multiple increased density areas 630, rack 110 may include multiple exhaust fans 218. For example, rack 110 may include a particular exhaust fan 218 aligned with each increased density area 630. Additionally or alternatively, opening 216 may be aligned with increased density area 630 to allow more air to flow over component 350 and exit rack 110 with less resistance (not shown in FIG. 6B).

Front portion 614 may include mounting hardware 320. Mounting hardware 320 may include, for example, screws to mount line card 600 using mounting area 215. Bottom portion 616 may include an angled section 618. Angled section 618 may provide a recessed area that may create an opening between line card 600 and another line card mounted below line card 600. The opening may allow entry air flow 130 to enter, through openings 620 of extended top portion 612, the area above PCB 340 of the line card mounted below line card 600 and cool components mounted on PCB 340 of the line card mounted below line card 600.

Front connectors 330 may provide electrical and/or optical connectors to cables that may provide electrical and/or optical connections to other electronic devices (e.g., other line cards mounted on rack 110 or line cards mounted in another rack). The number of front connectors 330 included in line card 600 may depend on a size of rack 110 and line card 600 and may be maximized to take up most of the area of front portion 614 of cookie sheet frame 610.

PCB 340 may provide a structurally stable substrate for mounting electrical and/or optical components of line card 600 and may include electrical and/or optical connections between the electrical and/or optical components. PCB 340 may include one or more components 350.

Although FIGS. 6A and 6B show example components of line card 600, in other implementations, line card 600 may include fewer components, different components, differently arranged components, or additional components than depicted in FIGS. 6A and 6B. Additionally or alternatively, one or more components of line card 600 may perform the tasks described as being performed by one or more other components of line card 600.

Figure 7:
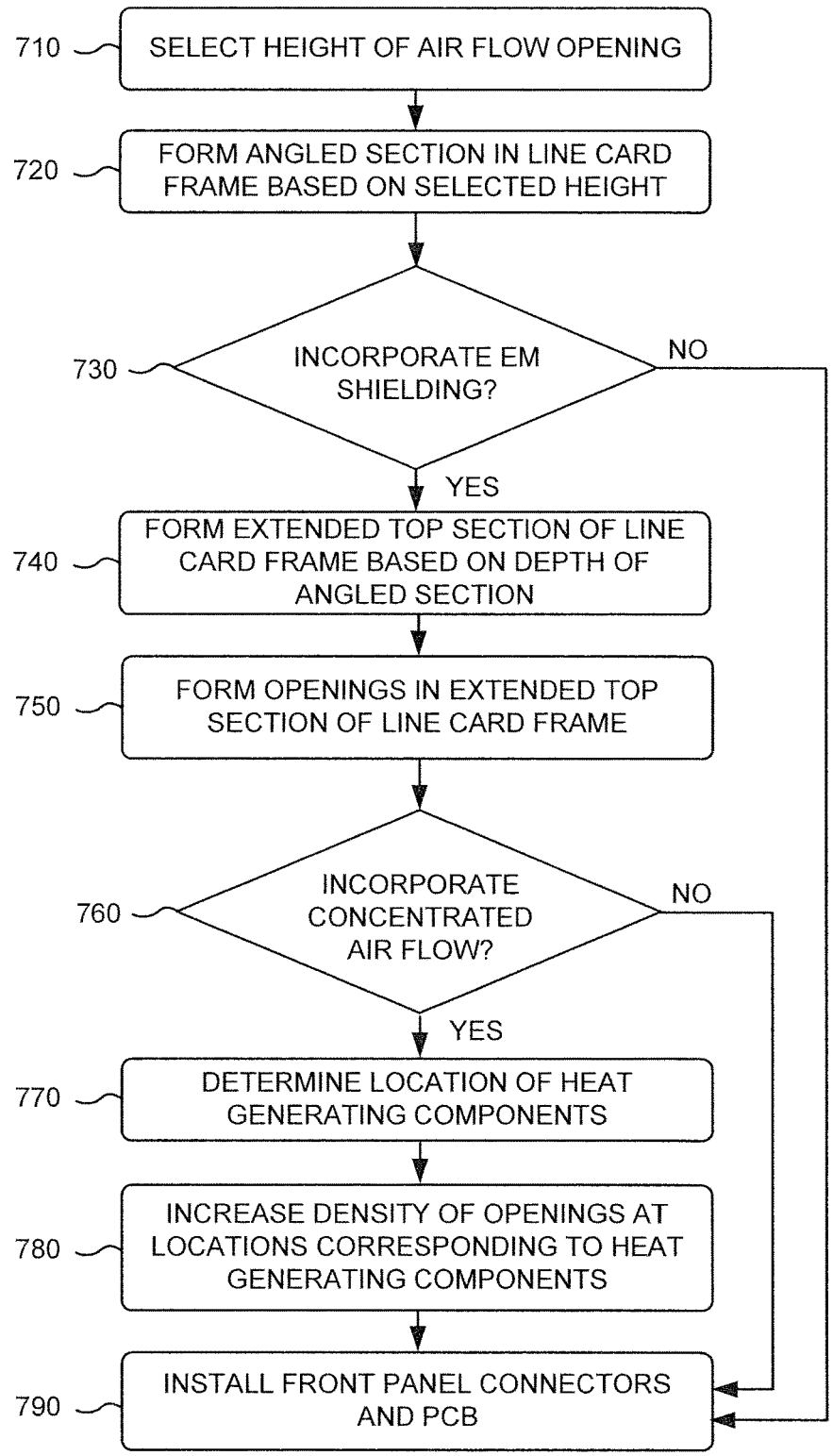
FIG. 7 is a diagram of a flow chart illustrating an example process for forming a line card according to an example implementation described herein.

FIG. 7 is a diagram of a flow chart illustrating an example process for forming a line card according to an example implementation described herein. The process of FIG. 7 may include selecting a height of an air flow opening (block 710). The height of opening 410 (or of opening 530) may be based on, for example, one or more of a height of connectors 330, a spacing of holes in mounting area 215, a spacing of line card connectors 212 of backplane 114, and/or a particular air flow requirement. For example, a first line card with components that generate more heat may require more air flow and, therefore, a second line card with a higher opening may be installed above the first line card to allow for more air flow.

An angled section of a line card may be formed based on the selected height (block 720). For example, angled section 318 (or angled sections 518 or 618) may be formed at an angle based on the selected height of opening 410 (or opening 530) and based on the desired length of angled section 318. The angled section of the line card may be formed, for example, by deforming the cookie sheet frame of the line card.

The process of FIG. 7 may include determining whether to incorporate EM shielding (block 730). For example, a first line card may include components that are more sensitive to EM interference or may include components that generate EM interference and may, therefore, require EM shielding. A second line card may not need EM shielding or may include components that should not be shielded (e.g., wireless receivers or transmitters).

If the determination is made that EM shielding is not to be incorporated (block 730—NO), processing may proceed to installing front panel connectors and a PCB (block 790, described below). If the determination is made that EM shielding is to be incorporated (block 730—YES), an extended top section of the line card frame may be formed based on the depth of the angled section (block 740). For example, cookie sheet frame 510 may be fabricated with extended top section 512. Cookie sheet frame 510 may be deformed to form extended top section 512.

Openings in the extended top section of the line card frame may be formed (block 750). For example, in one implementation, openings 520 may be drilled into extended top section 512 to form circular openings. In another implementation, openings 520 may be formed by a process other than drilling, such as via micromachining, laser cutting, or stamping. Using a process other than drilling may allow for forming openings with a shape other than a circular shape. For example, openings 520 may be formed as narrow slits. The size of the openings in the extended top section may be based on a wavelength of EM interference from which the line card is to be shielded. For example, the openings may be smaller than the wavelength of the highest frequency EM interference that is to be prevented from passing through the extended top section of the line card.

The process of FIG. 7 may include determining whether to incorporate concentrated air flow (block 760). For example, a first line card may include a component (e.g., a processor) at a particular location of PCB 340 that generates a significantly larger amount of heat than components at other locations of PCB 340. Thus, it may be determined to incorporate concentrated air flow into the first line card. A second line card may include components distributed on PCB 340 in such a way that there is not a significant difference in heat generation at particular locations of PCB 340. Thus, it may be determined that concentrated air flow need not be incorporated into the second line card.

If the determination is made that concentrated air flow is not to be incorporated (block 760—NO), processing may proceed to installing front panel connectors and a PCB (block 790, described below). If the determination is made that concentrated air flow is to be incorporated (block 760—YES), a location of heat generating components may be determined (block 770). For example, extended top section 620 may be aligned with PCB 340 to determine a region of extended top section 620 that corresponds to a location of a heat generating component located on PCB 340.

A density of openings at locations corresponding to locations of heat generating components may be increased (block 780). For example, increased density area 630 may be formed by forming additional openings 620. The density of openings in increased density area 630 may be based on an amount of increased air flow that is to be achieved through increased density area 630. For example, a first heat generating component may be aligned with a first increased density area and a second heat generating component, which generates less heat than the first heat generating component, may be aligned with a second increased density area with a smaller density of openings than the first increased density area.

Front panel connectors and a PCB may be installed (block 790). Once the cookie sheet frame has been fabricated, the PCB and the front panel connectors may be installed to the cookie sheet frame. For example, openings for front panel connectors 330 may be formed in front section 314 (or front section 514 or 614) and front panel connectors 330 may be snapped into place (or attached with a fastener and/or an adhesive). The PCB may be attached to the cookie sheet frame with fasteners and/or an adhesive.

CONCLUSION

The foregoing description provides illustration and description, but is not intended to be exhaustive or to limit the invention to the precise form disclosed. Modifications and variations are possible in light of the above teachings or may be acquired from practice of the invention.

For example, while a series of blocks has been described with respect to FIG. 7, the order of the blocks may be modified in other implementations. Further, non-dependent blocks may be performed in parallel.

It will be apparent that aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

It should be emphasized that the term "comprises/comprising" when used in this specification is taken to specify the presence of stated features, integers, steps, or components, but does not preclude the presence or addition of one or more other features, integers, steps, components, or groups thereof.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

What is claimed:
1. A frame comprising:
a front portion;

a bottom portion to receive attachment of a printed circuit board,
  the bottom portion including an angled section located at the front portion of the frame; and
a top portion that includes a plurality of openings located at the front portion of the frame,
  the plurality of openings including:
    a first set of openings with a first density of openings, and
    a second set of openings with a second density of openings,
      the second density of openings being greater than the first density of openings, and
    a depth of the frame being equal to a depth of a chassis frame that includes the frame.

2. The frame of claim 1, where the front portion includes connectors.

3. The frame of claim 1, where the printed circuit board includes one or more components.

4. The frame of claim 3, where the one or more components include:
  one or more electrical components, or
  one or more optical components.

5. The frame of claim 3, where a location of the second set of openings corresponds to a location of the one or more components.

6. The frame of claim 1, where the second set of openings is aligned with an exhaust fan of a chassis frame that includes the frame.

7. A frame of a line card comprising:
a front portion;
a bottom portion to receive attachment of a printed circuit board,
  the bottom portion including an angled section located at the front portion of the frame; and
a top portion that includes a plurality of openings located at the front portion of the frame,
  the plurality of openings including:
    a first set of openings with a first density of openings, and
    a second set of openings with a second density of openings, and
  a depth of the frame being equal to a depth of a chassis frame that includes the frame.

8. The frame of claim 7, where the front portion includes connectors.

9. The frame of claim 7, where the printed circuit board includes one or more components.

10. The frame of claim 9, where the one or more components include:
  one or more electrical components, or
  one or more optical components.

11. The frame of claim 7, where the first density of openings is different than the second density of openings.

12. The frame of claim 7, where the second density of openings is greater than the first density of openings.

13. The frame of claim 7, where the second set of openings is aligned with an exhaust fan of a chassis frame that includes the frame.

14. The frame of claim 7, where a location of the second set of openings corresponds to a location of one or more components included on the printed circuit board.

15. A frame comprising:
a front portion;
a bottom portion to receive attachment of a component that includes one or more electrical components or one or more optical components,
  the bottom portion including an angled section located at the front portion of the frame; and
a top portion that includes a plurality of openings located at the front portion of the frame,
  the plurality of openings including:
    a first set of openings with a first density of openings, and
    a second set of openings with a second density of openings,
      the second density of openings being different than the first density of openings, and
    a depth of the frame being equal to a depth of a chassis frame that includes the frame.

16. The frame of claim 15, where the second set of openings is aligned with an exhaust fan of a chassis frame that includes the frame.

17. The frame of claim 15, where a location of the second set of openings corresponds to a location of the one or more electrical components or the one or more optical components.

18. The frame of claim 15, where the front portion includes connectors.

19. The frame of claim 15, where the component includes a printed circuit board.

20. The frame of claim 1, where the second set of openings prevents electromagnetic interference.

* * * * *